United States Patent
Kwan

(10) Patent No.: US 9,097,985 B2
(45) Date of Patent: *Aug. 4, 2015

(54) LENS COMPRISING A PLURALITY OF OPTICAL ELEMENT DISPOSED IN A HOUSING

(71) Applicant: Carl Zeiss SMT GmbH, Oberkochen (DE)

(72) Inventor: Yim-Bun Patrick Kwan, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/227,107

(22) Filed: Mar. 27, 2014

(65) Prior Publication Data

US 2014/0293253 A1     Oct. 2, 2014

Related U.S. Application Data

(63) Continuation of application No. 11/916,470, filed on Nov. 10, 2010, now Pat. No. 8,717,534, which is a continuation of application No. PCT/EP2006/005855, filed on Jun. 19, 2006.

(60) Provisional application No. 60/692,080, filed on Jun. 20, 2005.

(51) Int. Cl.
| | |
|---|---|
| *G03B 27/42* | (2006.01) |
| *G03F 7/20* | (2006.01) |
| *G02B 7/00* | (2006.01) |
| *G02B 7/02* | (2006.01) |
| *G02B 27/62* | (2006.01) |

(52) U.S. Cl.
CPC ............ *G03F 7/70258* (2013.01); *G02B 7/003* (2013.01); *G02B 7/02* (2013.01); *G02B 7/021* (2013.01); *G02B 7/023* (2013.01); *G02B 27/62* (2013.01); *G03F 7/7085* (2013.01); *G03F 7/70341* (2013.01); *G03F 7/70825* (2013.01)

(58) Field of Classification Search
CPC ............ G03F 7/70825; G03F 7/70258; G03F 7/70775; G03F 7/7085; G03F 7/7095; G03F 9/7096; G02B 7/02; G02B 7/023; G02B 1/041; G02B 7/026; G02B 7/021; G02B 6/4204; H04N 5/2254
See application file for complete search history.

(56) References Cited

U.S. PATENT DOCUMENTS

| | | |
|---|---|---|
| 2003/0007138 A1 | 1/2003 | Shigematsu et al. |
| 2004/0239904 A1 | 12/2004 | Nishinaga |
| 2005/0002011 A1 | 1/2005 | Sudoh |

FOREIGN PATENT DOCUMENTS

| | | |
|---|---|---|
| EP | 1 245 984 | 10/2002 |
| WO | WO 99/49504 | 9/1999 |

OTHER PUBLICATIONS

International Search Report from the counterpart PCT Application No. PCT/EP2006/005855, filed Jun. 19, 2006.
International Preliminary Report with Written Opinion from the counterpart PCT Application No. PCT/EP2006/005855, dated Jan. 16, 2008.

*Primary Examiner* — Steven H Whitesell Gordon
*Assistant Examiner* — Mesfin T Asfaw
(74) *Attorney, Agent, or Firm* — Fish & Richardson P.C.

(57) ABSTRACT

The invention relates to a lens comprising several optical elements that are disposed in a lens housing. At least one sensor array encompassing at least one capacitive sensor unit and/or at least one inductive sensor unit is provided for determining the relative position between a first optical element and a second optical element or between a load-bearing structural element of the lens and a second optical element.

21 Claims, 4 Drawing Sheets

LENS COMPRISING A PLURALITY OF OPTICAL ELEMENT DISPOSED IN A HOUSING

CROSS-REFERENCE TO RELATED APPLICATIONS

This application is a continuation of, and claims priority under 35USC 120 to, U.S. application Ser. No. 11/916,470, filed Nov. 10, 2010, which is a National Phase application under 35 U.S.C. §371 filed from International Patent Application Serial No. PCT/EP2006/005855, filed on June 19, 2006, which claims priority to U.S. Provisional Application Ser. No. 60/692,080, filed Jun. 20, 2005. U.S. application Ser. No. 11/916,470 is hereby incorporated by reference in its entirety.

The invention relates to a lens comprising a plurality of optical elements disposed in a housing. The invention likewise relates to a method for determining the relative position between a first optical element, which is fixedly connected to a lens housing, and an exchangeable terminating element, and to a method for positioning an exchangeable terminating element in a lens of this type.

In projection lenses, particularly for microlithography, it is advantageous for the terminating element, in particular a terminating lens or the like, to be made exchangeable on account of deteriorations in its optical properties which occur over time.

The need for an exchangeable terminating element is intensified further in immersion lithography described for example in WO 99/49504, that is to say lithography in which an immersion medium is situated between the terminating element of the lens and the wafer to be exposed.

The terminating element, particularly if it comprises calcium fluoride, for example, is very sensitive to the sometimes aggressive immersion medium, such that it needs to be protected. Nevertheless, for example as a result of interaction with further chemical additives in the immersion medium, contamination of the terminating element can occur, such that the latter is no longer able to provide its full optical power and has to be exchanged after some time. The contaminations from the resists on the wafer and contaminations from the system for continuously exchanging the immersion medium may also be causes of the need for an exchange.

Very stringent requirements are made of the terminating element of an immersion lithography lens with regard to accuracy and possible tolerances, thereby making it more difficult to exchange the terminating element.

Since the precise position of the terminating element, primarily also in projection lenses having a high numerical aperture, has a great influence on the image quality of the overall optical system, such an exchange process requires, particularly in the use environment, a high positioning accuracy (sub-μm range) in up to six degrees of freedom.

One known approach for achieving such high accuracies in positioning is for example to provide the holder of the terminating element with an actuator system for manipulating the terminating element in up to six degrees of freedom, wherein the terminating element is first preadjusted with coarse accuracy and afterward the deviations are measured with the aid of an image quality measuring system and corrected. However, an actuator system of this type entails disadvantages with regard to complexity and costs and primarily with regard to the performance of the optical system due to a reduced axial stiffness of the holder of the terminating element, which adversely affects the image quality.

It is desirable, therefore, to restrict the number of actuated degrees of freedom, for example to the z, rx and ry directions, if the terminating element can be positioned or fitted with a sufficiently high accuracy during exchange in the horizontal plane (x and y directions, that is to say perpendicular to the beam direction or to the optical axis z).

The present invention is therefore based on the object of providing a lens and method of the type mentioned in the introduction which enable a very high accuracy in the positioning of an optical element or an exchangeable terminating element, particularly in the x and y directions perpendicular to the beam direction or to the optical axis, wherein complicated and cost-intensive built-in actuator systems can be dispensed with.

This object is achieved according to the invention by means of a lens comprising a plurality of optical elements disposed in a lens housing, wherein at least one sensor arrangement comprising at least one capacitive sensor unit and/or at least one inductive sensor unit is provided for determining the relative position between a first optical element and a second optical element or between a load-bearing structural element of the lens and a second optical element.

The measures according to the invention provide, in a simple and advantageous and also cost-effective manner, a lens in which capacitive and/or inductive sensors are provided for determining the relative position between a first optical element and a second optical element or between a structural element of the lens and a second optical element. This stationary and contactless measuring system is cost-effective and very accurate. A complicated built-in actuator system in five degrees of freedom is not required since it is possible to determine the concentricity or the orientation in the x and y directions in the horizontal plane, i.e. perpendicular to the optical axis or the beam direction (z axis), by means of two cylindrical reference surfaces. Furthermore, a relative position determination between a structural element of the lens and the second optical element can also be effected by means of the capacitive and/or inductive sensor units. In the case of an exchange or in the case of a positioning of the second optical element, in particular of an exchangeable terminating element, this can now be carried out very precisely in the field, i.e. in the use environment of the lens, such that it is possible to achieve accuracies of 1 μm to 10 nm in the x or y direction. Obtaining such an accuracy by means of optical sensors is relatively complicated and difficult since this would necessitate a measurement along the entire periphery.

The determination of the relative position can be effected in the x and y directions in a horizontal plane perpendicular to the beam direction, in particular perpendicular to the optical axis (z axis) of the lens. Furthermore, it is possible to perform the relative position determination in the z direction and also in the rx and ry directions (that is to say rotation about the x axis and y axis).

It is advantageous if the load-bearing structural element of the lens is the lens housing.

As a result, a relative position determination can also be carried out directly between the lens housing and the second optical element. In particular, the lens housing can be provided with reference surfaces for this purpose.

The lens can be embodied as a projection lens for microlithography.

According to the invention, it may furthermore be provided that the at least one sensor arrangement has at least three capacitive sensor units.

In one structural configuration of the invention, it may be provided that the at least three capacitive sensor units are arranged at uniform distances around the first and/or the second optical element.

The second optical element can be embodied in exchangeable fashion. In particular, the second optical element can be an exchangeable terminating element of the lens. Furthermore, the first optical element can be an optical element arranged downstream of the exchangeable terminating element in the direction of the optical axis of the lens.

The first optical element can be fixedly connected to the lens housing.

It is advantageous if a first sensor arrangement and a second sensor arrangement are provided.

The first sensor arrangement and the second sensor arrangement can in each case have four capacitive sensor units.

Furthermore, it is advantageous if the first sensor arrangement is oriented relative to the lens, wherein the second sensor arrangement is disposed in a fixedly predetermined or precisely known position relative to the first sensor arrangement.

According to the invention, it may furthermore be provided that the at least one sensor arrangement is disposed on an electrically insulating substrate ring composed of a material having a low coefficient of thermal expansion.

In a development of the invention, it may be provided that the material is glass, ceramic, quartz or glass ceramic, in particular Zerodur or the like.

A method for determining the relative position between a first optical element, which is fixedly connected to a lens housing, and an exchangeable terminating element or between the lens housing and the exchangeable terminating element in a lens is furthermore specified, wherein in a first step, the first sensor arrangement measures the position of the first and of the second sensor arrangement relative to the first optical element or to the lens housing, after which in a second step, the second sensor arrangement measures the position of the terminating element relative to the second sensor arrangement, and afterward in a third step, the position of the terminating element relative to the first optical element or to the lens housing is determined from the measurement results.

Moreover, a method for positioning an exchangeable terminating element in a lens is specified, wherein the terminating element is positioned by means of a positioning device, which has force-controlled manipulators, in six degrees of freedom using a relative position—determined by the above-mentioned method—of the terminating element with respect to the first optical element fixedly connected to the lens housing or with respect to the lens housing.

A projection exposure apparatus comprising an illumination system and comprising a lens according to the invention for producing semiconductor components and also a method for producing semiconductor components using such a projection exposure apparatus are specified in claims 19 and 20.

An embodiment of the invention is described in principle below with reference to the drawing.

Figure 1:
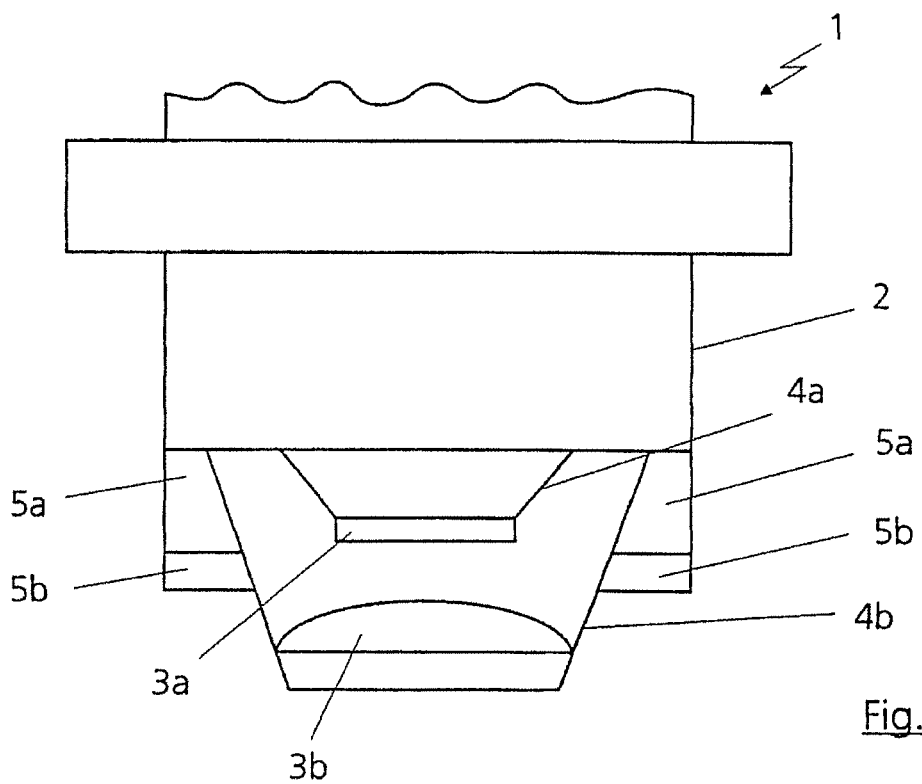
FIG. 1 shows a basic illustration of a lens according to the invention for immersion lithography.

FIG. 1 shows a lens which is embodied as a lithography lens 1, which is suitable for immersion lithography, in particular, but can also be used for other types of lithography and also for other purposes. The lens 1 can be used as projection lens in a projection exposure apparatus for producing semiconductor components with an illumination system. Since immersion lithography is known per se, this method is not discussed in any greater detail herein. The lithography lens 1 has an extremely schematically indicated lens housing 2 as load-bearing structural element, within which a plurality of optical elements are arranged in a manner known per se. FIG. 1 illustrates only a first, penultimate optical element 3a in the beam direction and a terminating element 3b as second optical element. The optical elements 3a, 3b are respectively arranged in a mount or holder 4a, 4b. In the present exemplary embodiment, the terminating element 3b is embodied in exchangeable fashion (not illustrated in any greater detail) and the penultimate optical element 3a in the beam direction, which optical element is disposed downstream of the terminating element 3b in the direction of the optical axis (z axis), is fixedly connected to the lens housing 2.

A first and a second sensor arrangement 5a, 5b each having four capacitive sensor units 6a, 6b (see FIGS. 2 to 4) are provided for determining a relative position in the x and y directions, that is to say perpendicular to the beam direction or to the optical axis (z axis), between the penultimate optical element 3a in the beam direction and the terminating element 3b. The sensor arrangements 5a, 5b make their measurement data available to further, in particular external devices, such as, for example, controllers or the like (not illustrated). During the measurement, averaging methods known from capacitive metrology can be used for eliminating or filtering the electronic noise. In further exemplary embodiments, inductive sensor units could also be provided. Both static electric/magnetic fields and alternating fields can be used. Furthermore, in other exemplary embodiments, a relative position determination could also be carried out between the lens housing 2 as load-bearing structural element and the terminating element 3b by means of corresponding sensor arrangements (not illustrated). For this purpose, the lens housing 2 could be provided with corresponding reference surfaces.

The first sensor arrangement 5a is oriented relative to the lens 1 or the lens housing 2 thereof or the first optical element 3a fixedly connected to the lens housing 2, wherein the second sensor arrangement 5b is arranged relative to the first sensor arrangement 5a in a fixedly predetermined or precisely known position.

For determining the relative position between the first optical element 3a fixedly connected to the lens housing 2 and the exchangeable terminating element 3b or between the lens housing 2 as structural element and the exchangeable terminating element 3b in the lens 1, in a first step, then, the first sensor arrangement 5a measures the position of the first sensor arrangement 5a and of the second sensor arrangement 5b relative to the first optical element 3a or, in a further exemplary embodiment, to the lens housing 2, after which, in a second step, the second sensor arrangement 5b measures the position of the terminating element 3b relative to the second sensor arrangement 5b and after which, in a third step, the position of the terminating element 3b in the x and y directions relative to the first optical element 3a or to the lens housing 2 is determined from the measurement results.

The measurement results determined continuously by means of the sensor arrangement 5b are then used for accurate positioning of the exchangeable terminating element 3b in the lens 1 in the event of an exchange. With the aid of a vibration-decoupled positioning device having force-controlled manipulators (e.g. Lorentz actuators or the like), the exchangeable terminating element 3b is positioned in six degrees of freedom after a previous coarse adjustment (not illustrated). The measurement results can also be made available directly to the positioning regulation.

As can furthermore be seen from FIG. 1, the sensor arrangements 5a, 5b measure the optical elements 3a, 3b on the basis of the holders or mounts 4a, 4b. In further exemplary embodiments, the optical elements 3a, 3b can also be measured directly. The holders or mounts 4a, 4b and the sensor arrangements 5a, 5b are only indicated extremely schematically in FIG. 1.

Figure 2:
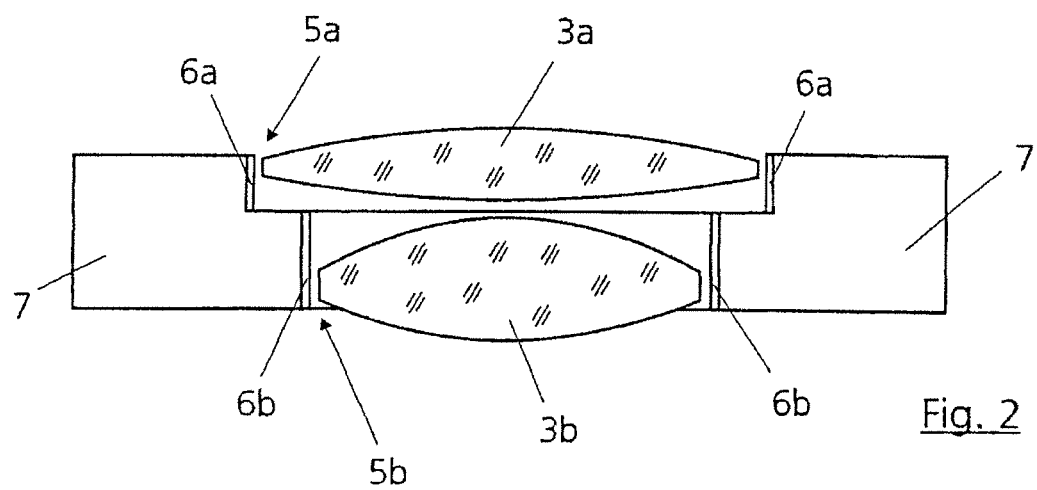
FIG. 2 shows a basic sectional view with a sensor arrangement, a terminating element and a penultimate optical element, in the beam direction, of a lens for immersion lithography.

FIG. 2 shows a further embodiment—illustrated in a greatly simplified manner—of a first sensor arrangement 5a and a second sensor arrangement 5b, which determine a relative position in the x and y directions between the first optical element 3a and the terminating element 3b. For this purpose, capacitive sensor units 6a and 6b are applied on an electrically insulating substrate ring 7 composed of a material having a low coefficient of thermal expansion. By means of the capacitive (or inductive) measurement, an averaging is already effected in an advantageous manner on account of the planar sensor units 6a, 6b. In the present exemplary embodiment, the material of the substrate ring 7 is Zerodur. In further exemplary embodiments, glass, ceramic, quartz or further glass ceramics could also be provided as material. The sensor units 6a, 6b are preferably applied as gold electrodes on the electrically insulating substrate ring 7 by vapor deposition.

In a further exemplary embodiment, the optical elements 3a, 3b could also be provided with preferably vapor-deposited metallic areas in their peripheral regions which face the sensor units 6a, 6b. Particularly in the case of inductive sensors, metal layers acting like coils could be applied.

Figure 3:
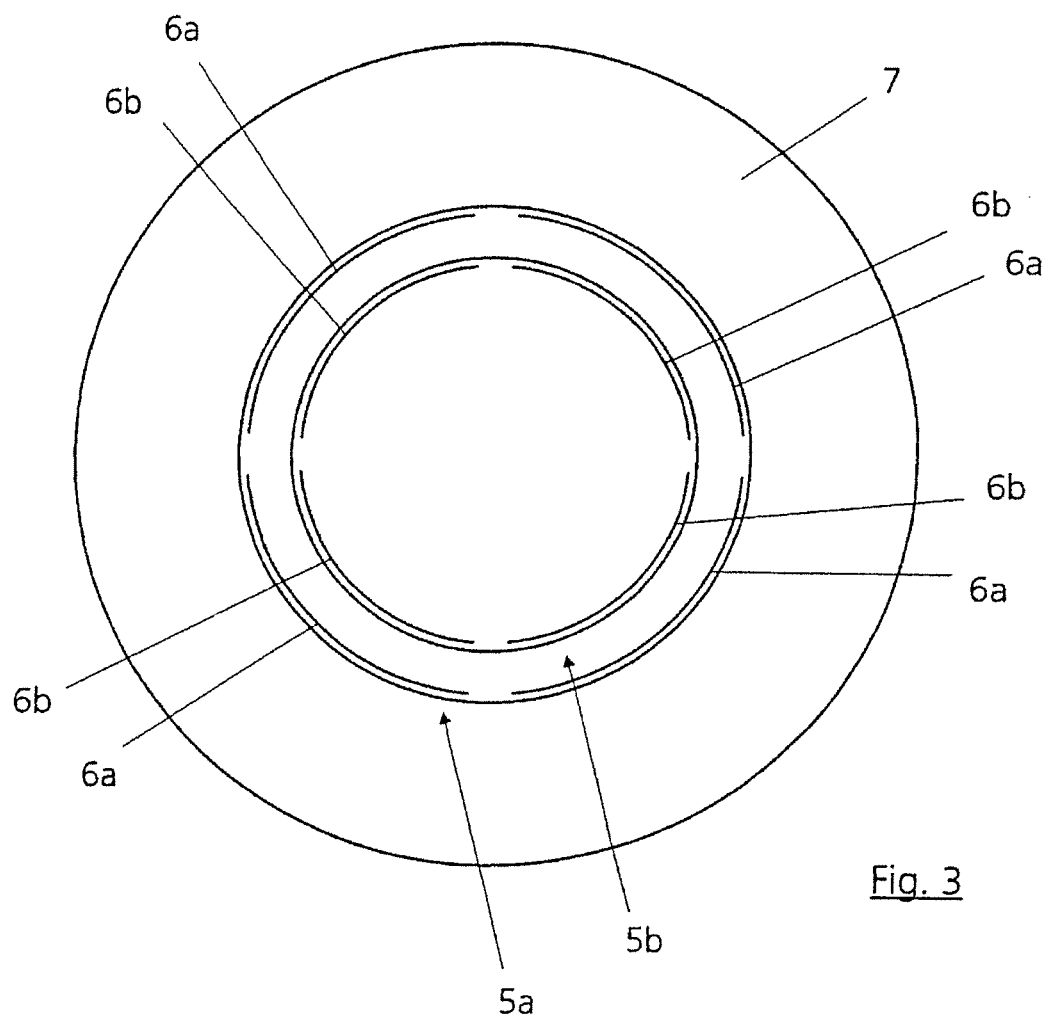
FIG. 3 shows a basic plan view of the sensor arrangement from FIG. 2.
Figure 4:
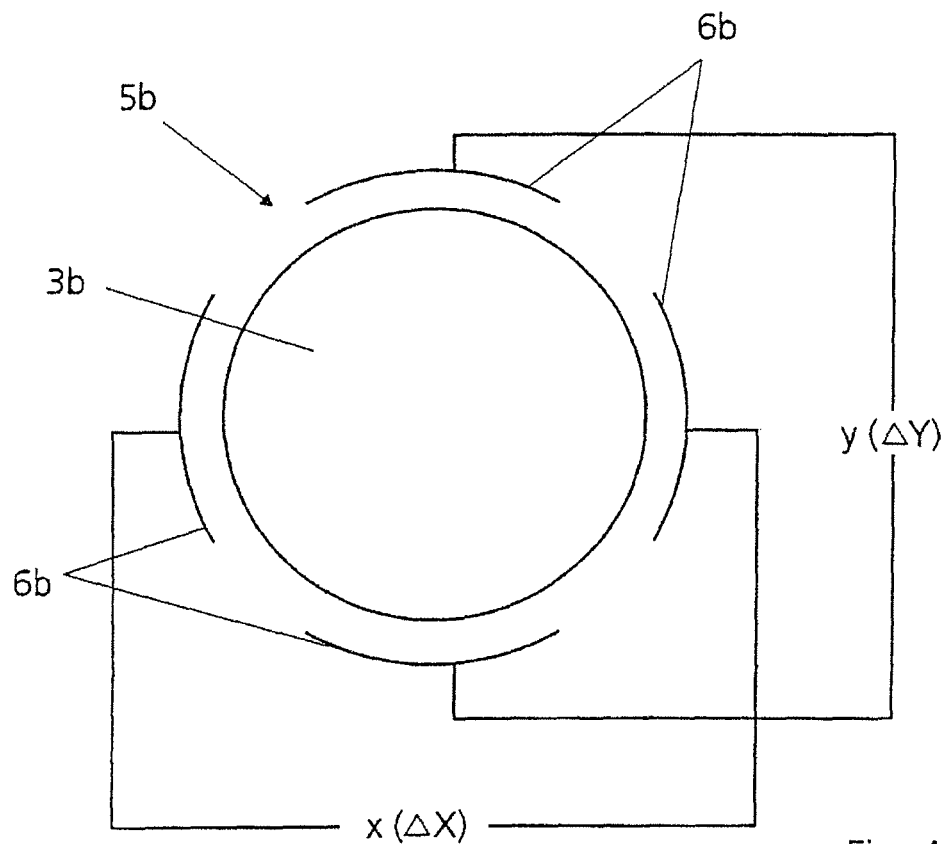
FIG. 4 shows a basic illustration of a sensor arrangement.

FIG. 3 illustrates the sensor arrangements 5a, 5b again in a plan view.

As can be seen from FIG. 3, the first sensor arrangement 5a and the second sensor arrangement 5b have in each case four sensor units 6a, 6b arranged at uniform distances around the periphery of the substrate ring 7 or of the optical elements 3a, 3b. 360° can thereby be covered. The optical elements 3a, 3b are not illustrated in FIG. 3. The gap between the reference surfaces of the optical elements 3a, 3b and the inner diameter of the substrate ring 7 can be set in order to achieve corresponding measurement resolutions. In order to calibrate the concentricity deviations between measuring surfaces 6a and 6b of the substrate ring 7, a reference object can be introduced into the substrate ring 7 in a simple and advantageous manner, after which a plurality of measuring operations with subsequent rotations of the reference object through 180° are carried out. Half the difference between two measurements yields the concentricity of the reference object. Half the sum of two measurements yields the concentricity error of the substrate ring 7. This can be repeated a number of times in order to eliminate random measuring errors and to determine a calibration value for future measurements.

FIG. 4 again illustrates the sensor arrangement 5b with the optical element 3b and the capacitive sensor units 6b. Accuracies in Δx and Δy of 1 μm to 10 nm are achieved in the capacitive measurement.

Figure 5:
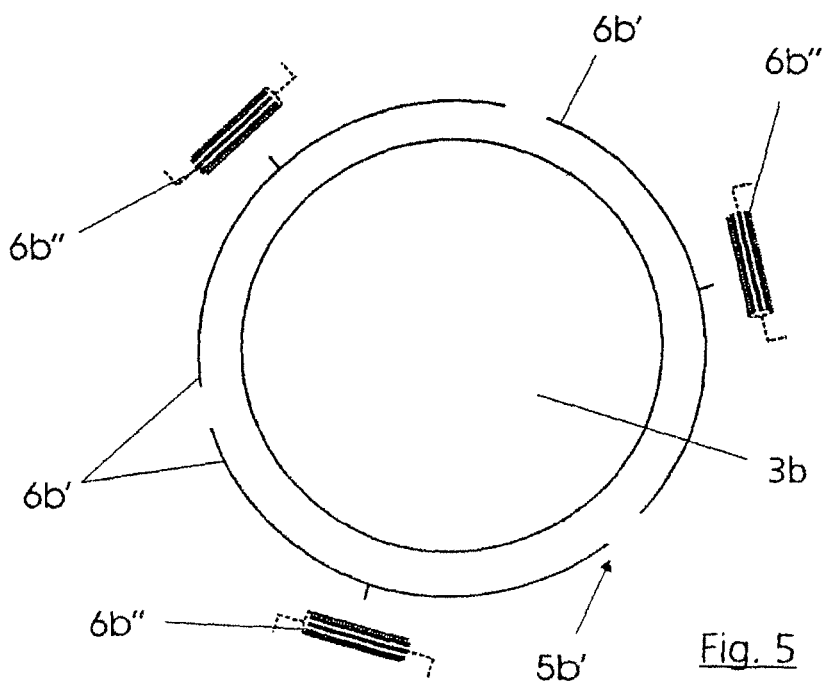
FIG. 5 shows a further basic illustration of an alternative embodiment of a sensor arrangement with three sensor units.

A further embodiment of a sensor arrangement 5b' with only three capacitive sensor units 6b' is illustrated in a simplified manner in FIG. 5. As an alternative, inductive sensor units could also be provided (represented by dashed lines as coils 6b'' in FIG. 5). The position of the optical element can be determined by the measurement of the only three capacitance or inductance values, for example by means of a look-up table, suitable calibration curves or the like. The sensors units 6b', 6b'' are preferably arranged at in each case 120° around the optical element 3b, such that the optical element 3b is advantageously arranged, in the case of a central positioning, essentially at the centroid of an equilateral triangle defined by the midpoints of the sensor units 6b', 6b''. In the case of a different arrangement, correspondingly deviating calibration curves result for the position determination.

Figure 6:
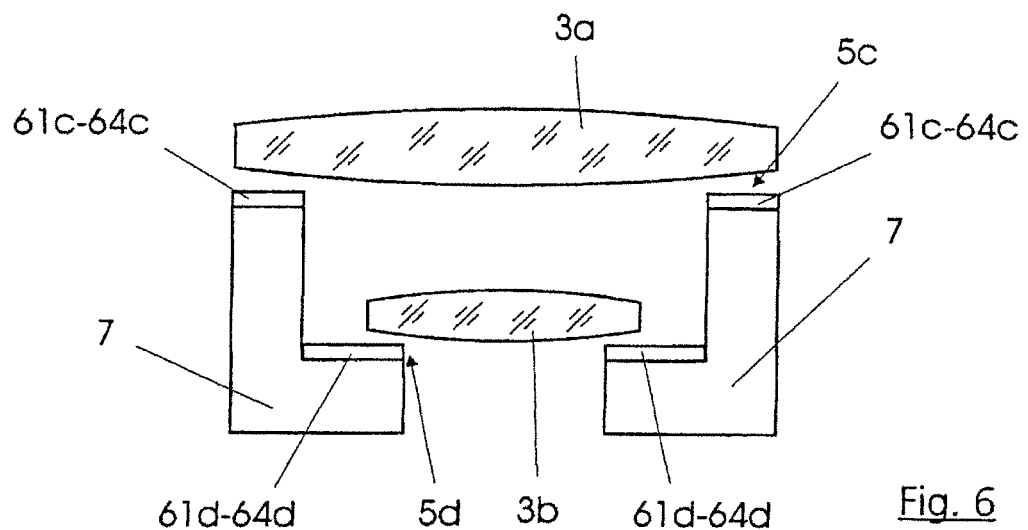
FIG. 6 shows a basic sectional view with an alternative sensor arrangement, a terminating element and a penultimate optical element, in the beam direction, of a lens for immersion lithography.
Figure 7:
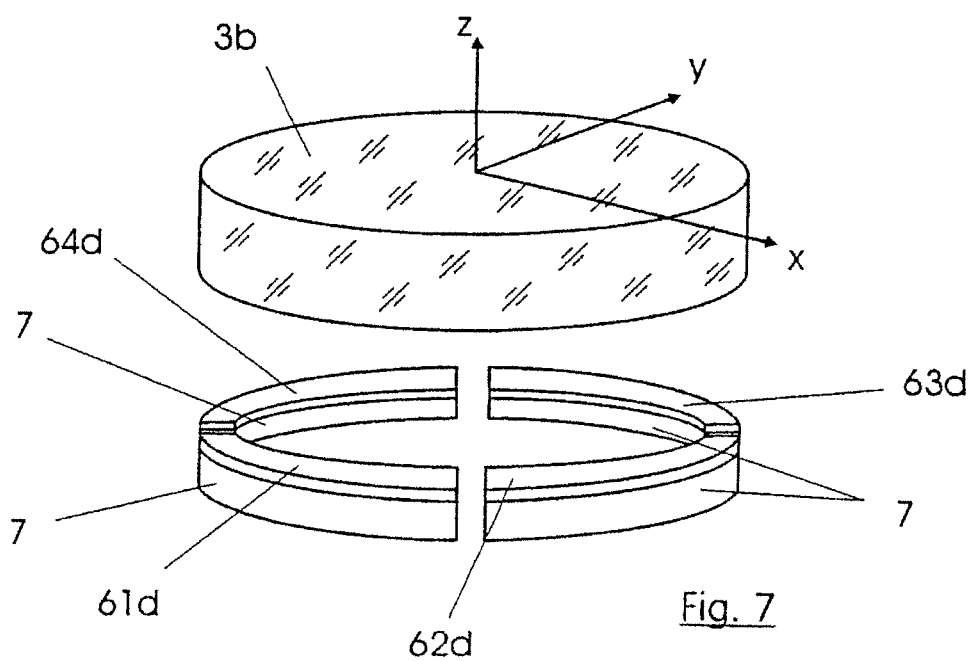
FIG. 7 shows a simplified perspective view of a part of the sensor arrangement from FIG. 6.

It goes without saying that the precise positioning can be performed analogously to FIG. 2 also in the z direction and in the rx and ry directions (that is to say rotation about the x axis and y axis). Such an arrangement is illustrated likewise in a greatly simplified manner in FIG. 6. For this purpose, a first and a second sensor arrangement 5c, 5d having in each case four capacitive sensor units 61c to 64c and 61d to 64d (for the terminating element 3b, also see FIG. 7) are provided between the penultimate optical element 3a in the beam direction and the terminating element 3b. The position determination in the z direction results in a simplified manner from $$\frac{\vec{C}_{61d} + \vec{C}_{62d} + \vec{C}_{63d} + \vec{C}_{64d}}{4},$$

where $\vec{C}_i$ represent the measured values of the associated sensor units 61d to 64d (for example in nm). The position determination in the rx direction in this case results from $$\frac{\vec{C}_{63d} - \vec{C}_{61d}}{2},$$

and in the ry direction from $$\frac{\vec{C}_{62d} - \vec{C}_{64d}}{2}.$$

The invention claimed is:
1. A lens, comprising:
a lens housing;
a plurality of optical elements disposed in the lens housing, the plurality of optical elements including first and second optical elements; and
at least one sensor arrangement comprising at least one capacitive sensor unit and/or at least one inductive sensor unit, the at least one sensor arrangement being configured to determine the relative position between the first optical element and the second optical element or between a load-bearing structural element of the lens and the second optical element,
wherein the at least one sensor arrangement is supported by an electrically insulating substrate comprising a material having a low coefficient of thermal expansion, and the electrically insulating substrate supports metal electrodes configured as sensor units.

2. The lens of claim 1, wherein, during use of the lens, the determination of the relative position is effected in the x and y directions in a horizontal plane perpendicular to a beam direction.

3. The lens of claim 1, wherein the lens comprises the load-bearing structural element, and the load-bearing structural element is the lens housing.

4. The lens of claim 1, wherein the at least one sensor arrangement comprises at least three capacitive sensor units.

5. The lens of claim 4, wherein the at least three capacitive sensor units are arranged at uniform distances around the first optical element and/or the second optical element.

6. The lens of claim 1, wherein the second optical element is exchangeable.

7. The lens of claim 6, wherein the second optical element is an exchangeable terminating optical element of the lens.

8. The lens of claim 6, wherein the first optical element is an optical element arranged downstream of the exchangeable terminating optical element in a direction of an optical axis of the lens.

9. The lens of claim 7, wherein the first optical element is fixedly connected to the lens housing.

10. The lens of claim 9, wherein the at least one sensor arrangement comprises a first sensor arrangement and a second sensor arrangement.

11. The lens of claim 10, wherein the first sensor arrangement and the second sensor arrangement in each case have four capacitive sensor units.

12. The lens of claim 11, wherein the first sensor arrangement is oriented relative to the lens, and the second sensor arrangement is disposed in a fixedly predetermined or precisely known position relative to the first sensor arrangement.

13. The lens of claim 1, wherein the at least one sensor arrangement is disposed on an electrically insulating substrate ring composed of a material having a low coefficient of thermal expansion.

14. The lens of claim 13, wherein the material comprises a material selected from the group consisting of glass, ceramic, quartz and glass ceramic.

15. The lens of claim 1, wherein the lens is a projection lens for microlithography.

16. The lens of claim 1, wherein the electrically insulating substrate is in the shape of a ring.

17. The lens of claim 1, wherein the electrodes are gold electrodes.

18. An apparatus, comprising:
an illumination system; and
a lens as claimed in claim 1,
wherein the apparatus is a projection exposure apparatus.

19. A method, comprising:
providing a lens housing, comprising:
a plurality of optical elements disposed in the lens housing, the plurality of optical elements including first and second optical elements; and
at least one sensor arrangement comprising at least one capacitive sensor unit and/or at least one inductive sensor unit, the at least one sensor arrangement being configured to determine the relative position between the first optical element and the second optical element or between a load-bearing structural element of the lens and the second optical element,
wherein:
the at least one sensor arrangement is supported by an electrically insulating substrate comprising a material having a low coefficient of thermal expansion;
the electrically insulating substrate supports metal electrodes configured as sensor units;
the second optical element is exchangeable an exchangeable terminating optical element of the lens;
the first optical element is fixedly connected to the lens housing;
the at least one sensor arrangement comprises a first sensor arrangement and a second sensor arrangement;
the first sensor arrangement and the second sensor arrangement in each case have four capacitive sensor units; and
the first sensor arrangement is oriented relative to the lens, and the second sensor arrangement is disposed in a fixedly predetermined or precisely known position relative to the first sensor arrangement;
using the first sensor arrangement to measure the position of the first and of the second sensor arrangement relative to the first optical element or to the lens housing, after which
using the second sensor arrangement to measure the position of the terminating element relative to the second sensor arrangement; and
after using the second sensor arrangement to measure the position of the terminating element relative to the second sensor arrangement, determining the position of the terminating element relative to the first optical element or to the lens housing from the measurement results.

20. The method of claim 19, further comprising positioning the terminating element via a positioning device comprising force-controlled manipulators in six degrees of freedom based on the relative position of the terminating element with respect to the first optical element fixedly connected to the lens housing or with respect to the lens housing.

21. A method, comprising
producing semiconductor components using a projection exposure apparatus as claimed in claim 20.

* * * * *

UNITED STATES PATENT AND TRADEMARK OFFICE
CERTIFICATE OF CORRECTION

PATENT NO. : 9,097,985 B2
APPLICATION NO. : 14/227107
DATED : August 4, 2015
INVENTOR(S) : Yim-Bun Patrick Kwan It is certified that error appears in the above-identified patent and that said Letters Patent is hereby corrected as shown below:

In the Specification

Col. 1, line 9, delete "35USC" and insert -- 35 USC --.

Signed and Sealed this
Eighth Day of March, 2016

Michelle K. Lee
*Director of the United States Patent and Trademark Office*